United States Patent
Becker et al.

(10) Patent No.: US 11,349,160 B2
(45) Date of Patent: May 31, 2022

(54) METHOD FOR CHECKING THE PLAUSIBILITY OF AN ELECTRONIC CIRCUIT FOR TIME MEASUREMENT OF AN ELECTROCHEMICAL ENERGY STORAGE SYSTEM

(71) Applicant: Robert Bosch GmbH, Stuttgart (DE)

(72) Inventors: Jens Becker, Benningen am Neckar (DE); Christoph Kroener, Rosstal (DE); Florian Stief, Benningen am Neckar (DE)

(73) Assignee: Robert Bosch GmbH, Stuttgart (DE)

( * ) Notice: Subject to any disclaimer, the term of this patent is extended or adjusted under 35 U.S.C. 154(b) by 367 days.

(21) Appl. No.: 16/711,769

(22) Filed: Dec. 12, 2019

(65) Prior Publication Data

US 2020/0259221 A1    Aug. 13, 2020

(30) Foreign Application Priority Data

Dec. 13, 2018  (DE) .......................... 102018221666.5

(51) Int. Cl.
| | | |
|---|---|---|
| *H01M 10/44* | (2006.01) | |
| *H01M 10/48* | (2006.01) | |
| *H01M 10/613* | (2014.01) | |
| *H01M 10/633* | (2014.01) | |
| *H01M 10/635* | (2014.01) | |
| *G01K 3/10* | (2006.01) | |
| *G08B 7/06* | (2006.01) | |
| *G08B 21/18* | (2006.01) | |
| *H01M 10/42* | (2006.01) | |
| *G01R 31/00* | (2006.01) | |
| *H02J 7/00* | (2006.01) | |

(52) U.S. Cl.
CPC ............ *H01M 10/486* (2013.01); *G01K 3/10* (2013.01); *G01R 31/00* (2013.01); *G08B 7/06* (2013.01); *G08B 21/185* (2013.01); *H01M 10/4257* (2013.01); *H01M 10/613* (2015.04); *H01M 10/633* (2015.04); *H01M 10/635* (2015.04); *H02J 7/00* (2013.01); *H01M 2010/4271* (2013.01)

(58) Field of Classification Search
CPC .... H02J 7/0047; H02J 7/0048; H01M 10/486; H01M 10/635; H01M 10/4257; H01M 2010/4271; G01K 3/10; G01R 31/00; G08B 21/185
USPC ................................ 320/107, 132, 149, 150
See application file for complete search history.

(56) References Cited

U.S. PATENT DOCUMENTS

| | | |
|---|---|---|
| 5,955,869 A | 9/1999 | Rathmann |
| 2018/0183252 A1 | 6/2018 | Kim et al. |

FOREIGN PATENT DOCUMENTS

| | | |
|---|---|---|
| DE | 4037640 A1 | 6/1992 |
| DE | 102004021441 A1 | 12/2005 |
| DE | 102005004998 A1 | 8/2006 |
| DE | 102013000220 B3 | 4/2014 |

*Primary Examiner* — Edward Tso
(74) *Attorney, Agent, or Firm* — Michael Best & Friedrich LLP

(57) ABSTRACT

Method for checking the plausibility of an electronic circuit for time measurement of an electrochemical energy storage system by means of a cooling behavior of at least one electrochemical energy store during non-use of the electrochemical energy store.

5 Claims, 2 Drawing Sheets

METHOD FOR CHECKING THE PLAUSIBILITY OF AN ELECTRONIC CIRCUIT FOR TIME MEASUREMENT OF AN ELECTROCHEMICAL ENERGY STORAGE SYSTEM

BACKGROUND OF THE INVENTION

The invention proceeds from a method for checking the plausibility of an electronic circuit for time measurement of an electrochemical energy storage system, an electrochemical energy storage system and use of an electrochemical energy storage system.

Document U.S. Pat. No. 5,955,869 discloses a method for monitoring the remaining capacity of a rechargeable battery pack. In said method, two different processes are used to estimate the remaining capacity. In a first process, the data generated on the rechargeable battery pack are used to estimate the remaining rechargeable battery capacity; and in the second procedure, data transmitted from a host device to the battery pack are used to estimate the remaining battery capacity. The rechargeable battery alternates between said two processes under defined conditions and, in the preferred embodiment, which is described in detail in the present description, the battery block alternates from the first procedure to the second procedure when the battery current falls below a threshold value.

Document US 2018/183252 discloses a method and provides an apparatus for detecting a battery state of an electronic apparatus. The electronic apparatus comprises a battery, a charging circuit for charging the battery, a measurement circuit for testing a state of the battery and a processor, which is configured to charge the battery using the charging circuit in order to determine whether the charging process fulfils a preset condition.

SUMMARY OF THE INVENTION

The approach according to the invention in contrast has the advantage that the check for plausibility is effected by means of a cooling behavior of at least one electrochemical energy store during non-use of the electrochemical energy store, comprising the following steps:

a) detecting an ambient temperature $T_{Env}$ of the electrochemical energy store;

b) detecting a temperature $T_{t0}$ of the electrochemical energy store at the beginning of the non-use of the electrochemical energy store;

c) detecting a temperature $T_{t1}$ of the electrochemical energy store at the beginning of a restart of the electrochemical energy store;

d) calculating a period toff of the non-use of the electrochemical energy store in accordance with the formula $$t_{off} = -\tau * \ln\left(\frac{T_{t1} - T_{Env}}{T_{t0} - T_{Env}}\right),$$

wherein $\tau$ is a system constant, which comprises material properties of the electrochemical energy store in accordance with $$\tau = \frac{m * c_p}{\alpha * A},$$

wherein m is a mass, A is a contact area, $\alpha$ is a thermal conductivity and $c_p$ is a specific thermal capacity of the electrochemical energy store;

e) determining an overall error in the calculation of the period $t_{off}$ of the non-use of the electrochemical energy store in accordance with the formula $\Delta t_{off}^{err} = \Delta t_1 + \Delta t_2 + \Delta t_3$, wherein $\Delta t1$ is a temperature measurement error during the restart of the electrochemical energy store, $\Delta t2$ is a temperature measurement error at the beginning of the non-use of the electrochemical energy store and $\Delta t3$ is a temperature measurement error of the ambient temperature;

f) checking the plausibility of the electronic circuit for time measurement by comparing a period $t_{off}^{Clock}$ of the non-use of the electrochemical energy store, which period is measured by the electronic circuit for time measurement, with the calculated period $t_{off}$ of the non-use of the electrochemical energy store; and g) identifying an error in the electronic circuit for time measurement when $\Delta t_{off}^{err} < |t_{off}^{Clock} - t_{off}|$.

The method for checking the plausibility of an electronic circuit for time measurement further can also comprise the following step:

h) generating an electrical, optical, acoustic and/or haptic signal when an error is identified in the electronic circuit for time measurement.

As a result thereof, for example, when an error is identified in the electronic circuit for time measurement, a user of the electrochemical energy storage system can be warned and/or the error can be stored for servicing purposes.

An electrochemical energy storage system advantageously comprises at least one electrochemical energy store, at least one sensor for detecting a temperature of the electrochemical energy store and/or an ambient temperature of the electrochemical energy store, an electronic circuit for time measurement and at least one means, in particular an electronic battery management control device, which is configured to carry out the steps of the method according to the invention.

A computer program advantageously comprises commands, which, when the computer program is executed by an electronic battery management control device, cause same to execute the method according to the invention.

The computer program is advantageously stored on a machine-readable storage medium.

An electrochemical energy storage system according to the invention is advantageously used for electric vehicles, hybrid vehicles, aircraft, plug-in hybrid vehicles, pedelecs or E-bikes, for portable telecommunications or data processing devices, for electrical hand tools or food processors, and in stationary stores for storing in particular regeneratively obtained electrical energy.

BRIEF DESCRIPTION OF THE DRAWINGS

Exemplary embodiments of the invention are illustrated in the drawing and explained in more detail in the following description.

In the drawing.

DETAILED DESCRIPTION

Figure 1:
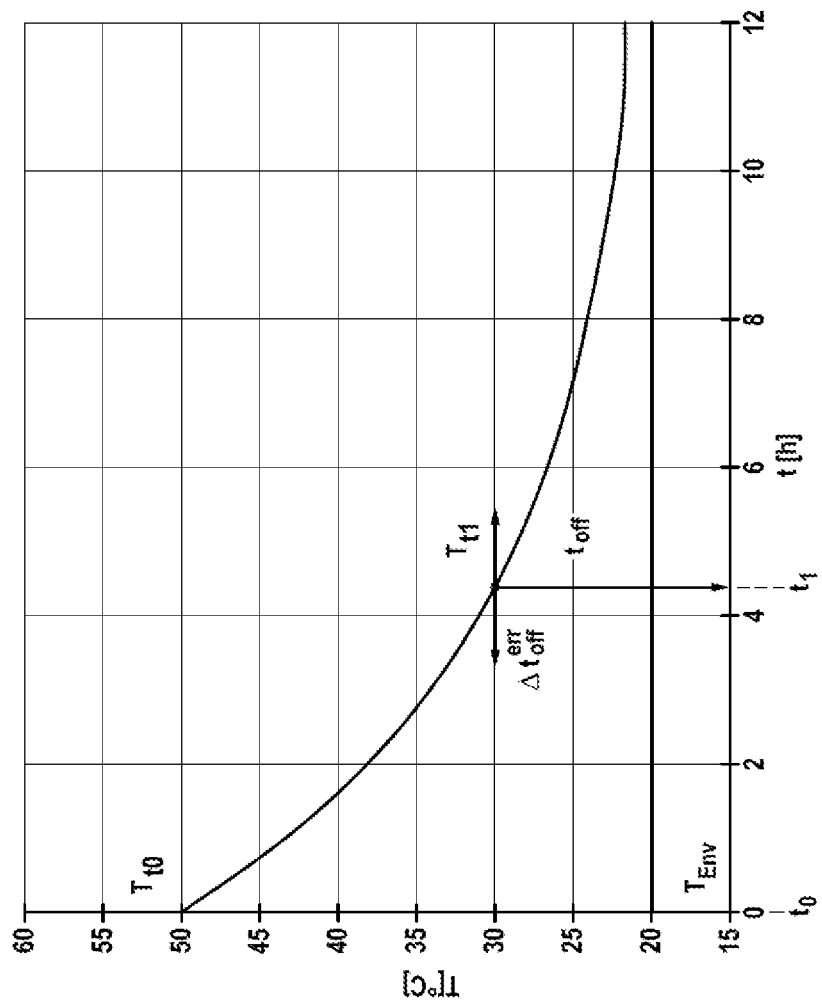
FIG. 1 shows a schematic illustration of a temperature profile of an electrochemical energy store during non-use.

FIG. 1 shows a schematic illustration of a temperature profile of an electrochemical energy store during non-use. Development of heat in an electrochemical energy store, in particular a high-voltage or low-voltage system, can be described by means of the following differential equation:

$$m * c_p * \frac{dT_{cell}}{dt} = \dot{Q}_{heat} + \alpha * A * (T_{Env} - T_{cell})$$

During use, for example during a charging or discharging process, of the electrochemical energy store, a power loss $\dot{Q}_{heat}$ is produced on account of an internal resistance of the electrochemical energy store and the electrochemical energy store assumes a somewhat higher temperature than the environment $T_{Env}$. During non-use, the power loss $\dot{Q}_{heat}$ is essentially zero and a temperature profile is dependent on a heat exchange with an environment of the electrochemical energy store and on a mechanical design of the electrochemical energy store with specific material properties, for example a mass m, a contact area A, a thermal conductivity $\alpha$ and a specific thermal capacity $c_p$ of the electrochemical energy store.

A period of non-use of the electrochemical energy store can be calculated by means of a cooling behavior of the electrochemical energy store during non-use.

FIG. 1 shows a temperature profile of an electrochemical energy store, for example a 48 volt battery pack. The electrochemical energy store has been heated at an ambient temperature $T_{Env}$ of 20° C. through use, for example through a discharging process, to a temperature $T_{t0}$ of 50° C. Non-use of the electrochemical energy store begins at a time $t_0$. The temperature profile illustrated corresponds to a cooling curve during non-use of the electrochemical energy store up to a time $t_1$ at which the electrochemical energy store is set in operation again. The electrochemical energy store is cooled at the time $t_1$ to a temperature $T_{t1}$ of 30° C.

The period $t_{off}$ of non-use of the electrochemical energy store can be calculated in accordance with the formula $$t_{off} = -\tau * \ln\left(\frac{T_{t1} - T_{Env}}{T_{t0} - T_{Env}}\right),$$

wherein $\tau$ is a system constant, which comprises the material properties of the electrochemical energy store in accordance with $$\tau = \frac{m * c_p}{\alpha * A}.$$

The system constant $\tau$ can be determined, for example, analytically or experimentally. In the case of the experimental determination, the electrochemical energy store at a given ambient temperature $T_{Env}$ can thus be brought to a higher temperature. By means of observing and measuring a temperature profile at a plurality of times during non-use of the electrochemical energy store, the system constant $\tau$ can be identified by way of a standard method, for example least square. Ideally, the experimental parameter determination is carried out after the electrochemical energy store has been installed, for example in a vehicle. This can minimize measurement and model inaccuracies.

An accuracy of the identified period $t_{off}$ of non-use can be identified by means of methods for error propagation. A first partial error $$\Delta t_1 = \left| \frac{-\tau}{T_{t0} - T_{Env}} \right| * \Delta T_{t1}$$

is caused by a temperature measurement error upon restart of the electrochemical energy store, a second partial error $$\Delta t_2 = \left| \frac{\tau}{T_{t0} - T_{Env}} \right| * \Delta T_{t0}$$

is caused by a temperature measurement error at the beginning of non-use of the electrochemical energy store and a third partial error $$\Delta t_3 = \left| \frac{-\tau * (T_{t1} - T_{t0})}{(T_{t1} - T_{Env}) * (T_{t0} - T_{Env})} \right| * \Delta T_{Env}$$

is caused by a temperature measurement error of an ambient temperature of the electrochemical energy store. An overall error $\Delta t_{off}^{err}$ in the calculation of the period $t_{off}$ of non-use of the electrochemical energy store results from a sum of all of the partial errors $t_{off} = \Delta t_1 + \Delta t_2 + \Delta t_3$.

The inaccuracies of the individual input variables $\Delta T_{t3}$, $\Delta T_{t0}$, $\Delta T_{Env}$ can be determined experimentally, for example in a vehicle, since the measurement inaccuracy of a temperature of the electrochemical energy store increases when no power loss is produced in the electrochemical energy store in a short period of time, usually a few minutes, and a homogenous temperature distribution in the electrochemical energy store can be assumed.

A check for the plausibility of an electronic circuit for time measurement of an electrochemical energy storage system is effected by means of a cooling behavior of at least one electrochemical energy store during non-use of the electrochemical energy store in one advantageous embodiment by means of comparing a period $t_{off}^{Clock}$ of non-use of the electrochemical energy store, which period is measured by the electronic circuit, with the calculated period $t_{off}$ of non-use of the electrochemical energy store.

A difference between the measured period $t_{off}^{clock}$ and the calculated period $t_{off}$ must be within a tolerance range of the overall error $\Delta t_{off}^{err}$, otherwise the electronic circuit for time measurement has an error.

electronic circuit for time measurement functions in a fault free manner:

$$\Delta t_{off}^{err} \geq |t_{off}^{Clock} - t_{off}|$$

electronic circuit for time measurement is faulty:

$$\Delta t_{off}^{err} < |t_{off}^{Clock} - t_{off}|$$

Figure 2:
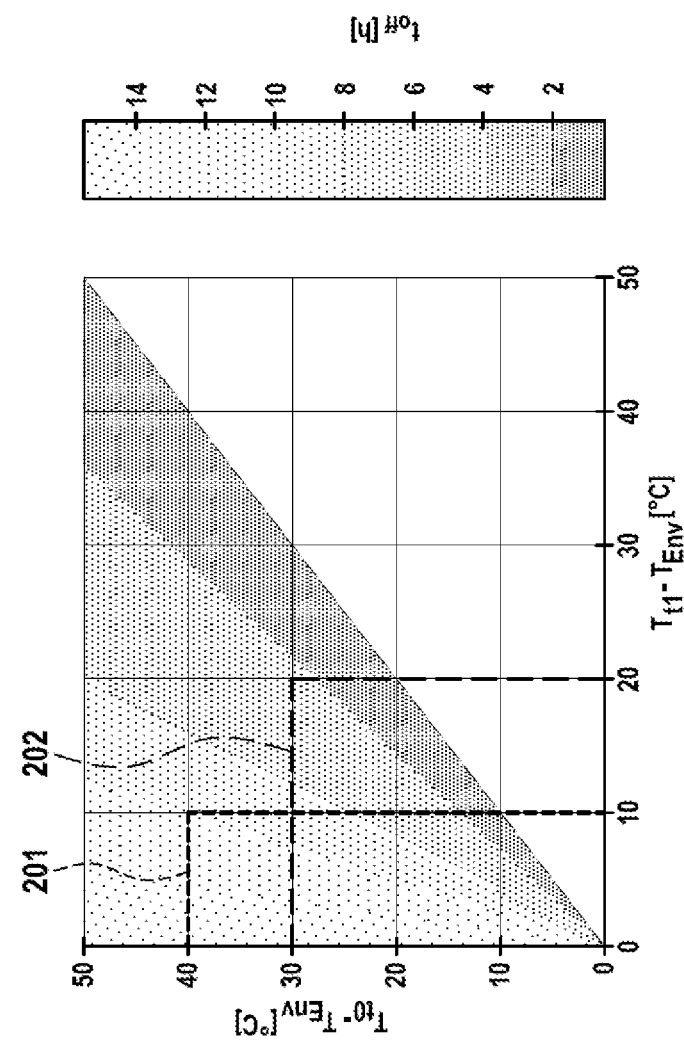
FIG. 2 shows a schematic illustration of a temperature-dependent period of the non-use of an electrochemical energy store.

FIG. 2 shows a schematic illustration of a temperature-dependent period of the non-use of an electrochemical energy store. A difference $T_{t1} - T_{Env}$ between a temperature $T_{t1}$ of the electrochemical energy store at the beginning of a restart of the electrochemical energy store and an ambient temperature $T_{Env}$ of the electrochemical energy store is plotted on the abscissa. A difference $T_{t0} - T_{Env}$, between a temperature $T_{t0}$ of the electrochemical energy store at the beginning of non-use of the electrochemical energy store and an ambient temperature $T_{Env}$ of the electrochemical energy store is plotted on the ordinate. For the illustration of the period of non-use calculated in accordance with the invention, as values for example 4 hours is assumed for the system constant $\tau$ and $\Delta T_{t1}=3$ kelvins, $\Delta T_{t2}=6$ kelvins and $\Delta T_{Env}=1.5$ kelvins are assumed for the temperature measurement accuracies.

In a first example, a temperature difference $T_{t0}-T_{Env}$ is 40 kelvins at a time of non-use of the electrochemical energy store. Upon restart, a temperature difference $T_{t1}-T_{Env}$ is 10 kelvins. A temperature-dependent period 201 of non-use of the electrochemical energy store is approximately 5 hours.

In a second example, a temperature difference $T_{t0}-T_{Env}$ is 30 kelvins at a time of non-use of the electrochemical energy store. Upon restart, a temperature difference $T_{t1}-T_{Env}$ is 20 kelvins. A temperature-dependent period 202 of non-use of the electrochemical energy store is approximately 3 hours.

The invention claimed is:

1. A method for checking the plausibility of an electronic circuit for time measurement of an electrochemical energy storage system by means of a cooling behavior of at least one electrochemical energy store during non-use of the electrochemical energy store, the method comprising the following steps:
   a) detecting an ambient temperature $T_{Env}$ of the electrochemical energy store;
   b) detecting a temperature $T_{t0}$ of the electrochemical energy store at the beginning of the non-use of the electrochemical energy store;
   c) detecting a temperature $T_{t1}$ of the electrochemical energy store at the beginning of a restart of the electrochemical energy store;
   d) calculating a period toff of the non-use of the electrochemical energy store in accordance with the formula $$t_{off} = -\tau * \ln\left(\frac{T_{t1} - T_{Env}}{T_{t0} - T_{Env}}\right),$$

wherein $\tau$ is a system constant, which comprises material properties of the electrochemical energy store in accordance with $$\tau = \frac{m * c_p}{\alpha * A},$$

wherein
   m is a mass,
   A is a contact area,
   $\alpha$ is a thermal conductivity and $c_p$ is a specific thermal capacity of the electrochemical energy store;
   e) determining an overall error in the calculation of the period $t_{off}$ of the non-use of the electrochemical energy store in accordance with the formula $\Delta t_{off}^{err}=\Delta t_1+\Delta t_2+\Delta t_3$, wherein
   $\Delta t_1$ is a temperature measurement error during the restart of the electrochemical energy store,
   $\Delta t_2$ is a temperature measurement error at the beginning of the non-use of the electrochemical energy store and
   $\Delta t_3$ is a temperature measurement error of the ambient temperature;
   f) checking the plausibility of the electronic circuit for time measurement by comparing a period $t_{off}^{Clock}$ of the non-use of the electrochemical energy store, which period is measured by the electronic circuit for time measurement, with the calculated period $t_{off}$ of the non-use of the electrochemical energy store;
   g) identifying an error in the electronic circuit for time measurement when $\Delta t_{off}^{err}<|t_{off}^{Clock}-t_{off}|$; and
   h) generating at least one selected from a group consisting of an electrical signal, an optical signal, an acoustic signal, and a haptic signal when an error is identified in the electronic circuit for time measurement.

2. An electrochemical energy storage system comprising at least one electrochemical energy store, at least one sensor for detecting at least one selected from a group consisting of a temperature of the electrochemical energy store and an ambient temperature of the electrochemical energy store, an electronic circuit for time measurement and at least one means configured to carry out the steps of the method according to claim 1.

3. An electronic battery management control device executing a computer program, comprising commands, which, when the computer program is executed by an electronic battery management control device, cause the electronic battery management control device to execute the method according to claim 1.

4. A non-transitory, machine-readable storage medium, on which a computer program is stored, and which, if the computer program is executed by an electronic battery management control device, causes the electronic battery management control device to execute the method according to claim 1.

5. An electrochemical energy storage system comprising at least one electrochemical energy store, at least one sensor for detecting at least one selected from a group consisting of a temperature of the electrochemical energy store and an ambient temperature of the electrochemical energy store, an electronic circuit for time measurement and an electronic battery management control device configured to carry out the steps of the method according to claim 1.

* * * * *